(12) United States Patent
Brown et al.

(10) Patent No.: US 7,514,285 B2
(45) Date of Patent: Apr. 7, 2009

(54) ISOLATION SCHEME FOR REDUCING FILM STRESS IN A MEMS DEVICE

(75) Inventors: Gregory C. Brown, Chanhassen, MN (US); Curtis H. Rahn, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 444 days.

(21) Appl. No.: 11/333,015

(22) Filed: Jan. 17, 2006

(65) Prior Publication Data

US 2007/0164379 A1    Jul. 19, 2007

(51) Int. Cl.
*H01L 21/762* (2006.01)
(52) U.S. Cl. .................... 438/50; 438/53; 438/439; 257/E29.324
(58) Field of Classification Search ........... 257/E27.006
See application file for complete search history.

(56) References Cited

U.S. PATENT DOCUMENTS

| | | | |
|---|---|---|---|
| 4,999,314 A * | 3/1991 | Pribat et al. ............. | 438/481 |
| 6,493,502 B1 | 12/2002 | Deliwala | |
| 6,526,187 B1 | 2/2003 | Deliwala | |
| 6,603,889 B2 | 8/2003 | Deliwala | |
| 6,608,945 B2 | 8/2003 | Deliwala | |
| 6,611,636 B2 | 8/2003 | Deliwala | |
| 6,625,348 B2 | 9/2003 | Deliwala | |
| 6,646,747 B2 | 11/2003 | Deliwala | |
| 6,654,511 B2 | 11/2003 | Deliwala | |
| 6,658,173 B2 | 12/2003 | Deliwala | |
| 6,671,443 B2 | 12/2003 | Deliwala | |
| 6,690,844 B2 | 2/2004 | Deliwala | |
| 6,690,863 B2 | 2/2004 | Deliwala | |
| 6,738,546 B2 | 5/2004 | Deliwala | |
| 6,748,125 B2 | 6/2004 | Deliwala | |
| 6,760,498 B2 | 7/2004 | Deliwala | |
| 6,823,112 B2 | 11/2004 | Deliwala | |
| 6,826,320 B2 | 11/2004 | Deliwala | |
| 6,842,546 B2 | 1/2005 | Deliwala | |
| 6,845,198 B2 | 1/2005 | Montgomery | |
| 6,869,881 B2 | 3/2005 | Deliwala | |
| 6,879,751 B2 | 4/2005 | Deliwala | |
| 6,891,685 B2 | 5/2005 | Deliwala | |
| 6,891,985 B2 | 5/2005 | Deliwala | |
| 6,895,136 B2 | 5/2005 | Deliwala | |
| 6,897,498 B2 | 5/2005 | Gothoskar et al. | |
| 6,898,352 B2 | 5/2005 | Deliwala | |
| 6,912,330 B2 | 6/2005 | Deliwala | |
| 6,917,730 B2 | 7/2005 | Ghiron et al. | |
| 6,934,444 B2 | 8/2005 | Ghiron et al. | |
| 6,944,369 B2 | 9/2005 | Deliwala | |
| 6,947,615 B2 | 9/2005 | Deliwala | |

(Continued)

FOREIGN PATENT DOCUMENTS

JP    04299871 A    * 10/1992

*Primary Examiner*—Stephen W Smoot

(57) ABSTRACT

A method of electrically isolating a MEMS device is provided. In one example, a piezo-resistive pressure sensor having an exposed silicon region undergoes a Local Oxidation of Silicon (LOCOS) process. An electrically insulating structure is created in the LOCOS process. The insulating structure has a rounded, or curved, interface with the piezo-resistive pressure sensor. The curved interface mitigates stresses associated with exposure to high temperatures and pressures. Additionally, the electrically insulating line may be patterned so that it has curved angles, further mitigating stress.

15 Claims, 3 Drawing Sheets

U.S. PATENT DOCUMENTS

| | | |
|---|---|---|
| 6,963,118 B2 | 11/2005 | Deliwala et al. |
| 6,968,110 B2 | 11/2005 | Patel et al. |
| 6,980,720 B2 | 12/2005 | Gothoskar et al. |
| 6,993,225 B2 | 1/2006 | Patel et al. |
| 6,993,243 B2 | 1/2006 | Deliwala |
| 7,000,207 B2 | 2/2006 | Gothoskar et al. |
| 7,020,364 B2 | 3/2006 | Ghiron et al. |
| 7,381,582 B2 * | 6/2008 | Johnson et al. ............... 438/48 |
| 2003/0054639 A1 | 3/2003 | Deliwala |
| 2004/0223768 A1 | 11/2004 | Shatri et al. |
| 2004/0240822 A1 | 12/2004 | Patel et al. |
| 2004/0258347 A1 | 12/2004 | Ghiron et al. |
| 2005/0094938 A1 | 5/2005 | Ghiron et al. |
| 2005/0094939 A1 | 5/2005 | Ghiron et al. |
| 2005/0110108 A1 | 5/2005 | Vipulkumar et al. |
| 2005/0123232 A1 | 6/2005 | Piede et al. |
| 2005/0135727 A1 | 6/2005 | Piede |
| 2005/0152658 A1 | 7/2005 | Keyser |
| 2005/0179986 A1 | 8/2005 | Gothoskar |
| 2005/0189591 A1 | 9/2005 | Gothoskar et al. |
| 2005/0194990 A1 | 9/2005 | Gothoskar et al. |
| 2005/0201683 A1 | 9/2005 | Ghiron et al. |
| 2005/0213873 A1 | 9/2005 | Piede et al. |
| 2005/0236619 A1 | 10/2005 | Patel et al. |
| 2005/0289490 A1 | 12/2005 | Shastri et al. |
| 2006/0018587 A1 | 1/2006 | Lakshminarayana et al. |
| 2007/0138581 A1 * | 6/2007 | Baer et al. .................. 257/414 |

* cited by examiner

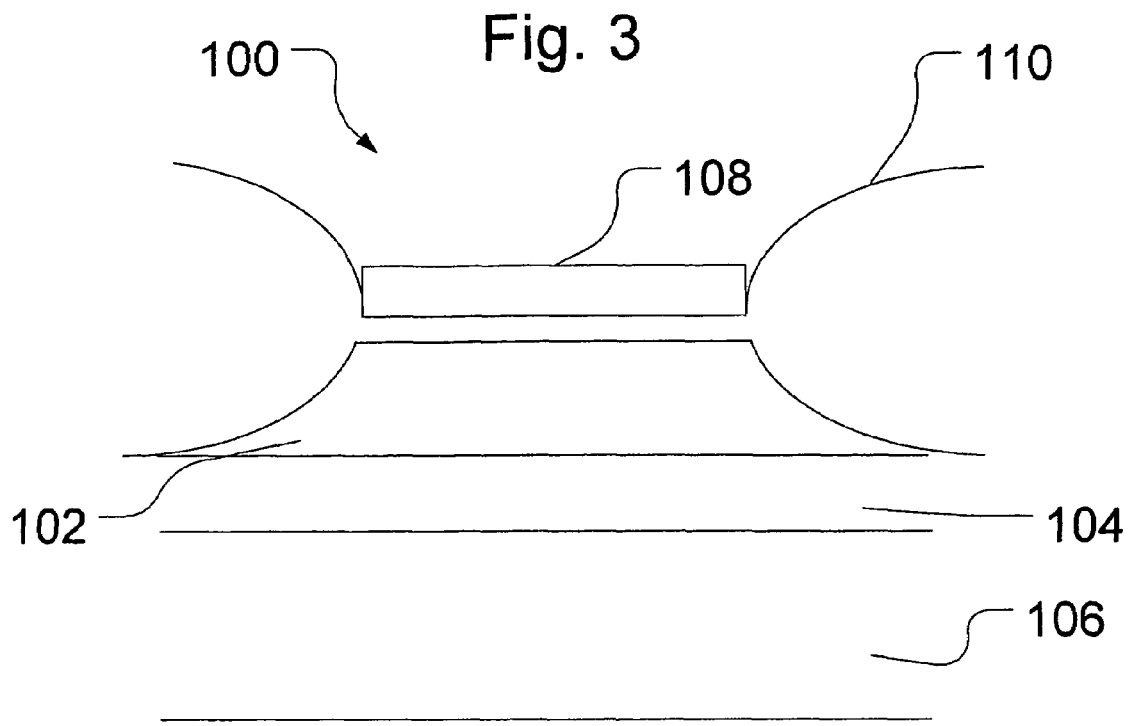
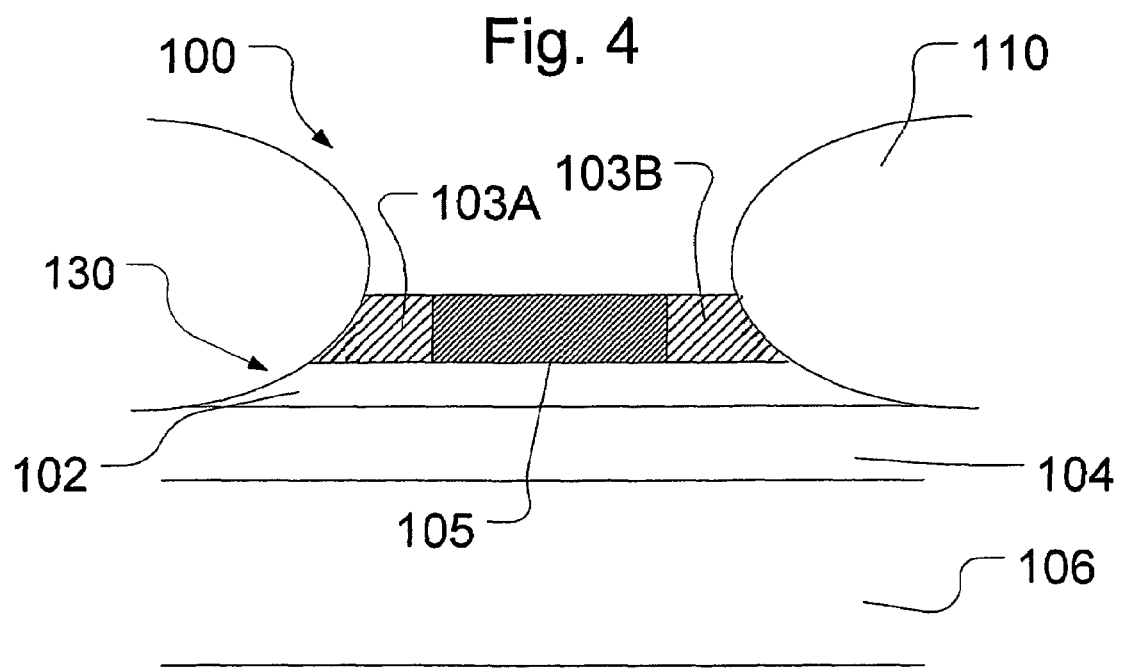

ISOLATION SCHEME FOR REDUCING FILM STRESS IN A MEMS DEVICE

FIELD

The present invention relates generally to the fabrication of micro-electro-mechanical structures, and more particularly, relates to a favorable method of creating electrical isolation for a micro-electro-mechanical structure that minimizes stress concentrations.

BACKGROUND

Silicon-On-Insulator (SOI) based technology allows a micro-electronic or Micro-Electro-Mechanical System (MEMS) device to be fabricated in a silicon layer that is located above an insulating layer (e.g. a buried oxide layer). The insulating layer is located over a silicon substrate. Electronic devices, such as transistors and MEMS-type devices are fabricated in the layer of silicon located on top of the insulating layer. This technique may provide higher speeds and use less power by reducing capacitance, reducing or eliminating the reverse leakage of the p-n junctions and thus making device operation in SOI superior to devices fabricated in conventional Complementary Metal-Oxide Semiconductor (CMOS) bulk silicon based processing.

One MEMS type device that may be implemented in SOI is a pressure sensor. Pressure sensors typically include a piezo-resistor coupled with a diaphragm. The piezo-resistor is embedded in the diaphragm, and responds to a change in stress of the diaphragm with a change in resistance as a consequence of the piezo-resistive effect. When the pressure applied to the diaphragm changes, the amount of deflection of the diaphragm changes accordingly, which results in a change in the stress level in the silicon diaphragm. This in turn causes the piezo-resistor element to increase or decrease in resistance. Thus, the increase or decrease in resistance may be used to gauge the amount of pressure being applied to the diaphragm.

Pressure sensors are used in a wide variety of environments. Some environments include high temperatures and/or high pressures. Because the pressure sensor is fabricated from semiconductor materials that have different thermal coefficients, extreme temperatures may cause the various layers of the pressure sensors to expand at different rates. In particular, the silicon dioxide ($SiO_2$) electrical isolation layer expands and contracts at a different rate than the silicon layer that comprises the piezo-resistor.

As a pressure sensor is cycled between low and high temperatures, the electrical isolation layer may begin to crack. This is especially true if stress concentration areas are present. Cracking may also be caused by extremely high pressures or the combined effects of high temperature and pressure. The present application describes a way to minimize stress concentration areas in piezo-resistive, SOI pressure sensors and other MEMS devices.

SUMMARY

The present application describes a method of creating electrical isolation for a MEMS device which eliminates stress cracking due to the affects of higher temperatures and/or pressures. The method includes forming a mask over the MEMS device and growing a silicon dioxide ($SiO_2$) electrical isolation layer, via a Local Oxidation of Silicon (LOCOS), in between the MEMS device and other MEMS devices. The LOCOS process creates a curved, or rounded, interface between the $SiO_2$ layer and the MEMS device. The rounded interface relaxes stresses associated with high temperatures or pressures.

In a provided example, one type of MEMS device, a piezo-resistive pressure sensor, is masked. The unmasked regions surrounding the sensor are then oxidized, via LOCOS, to produce an electrical isolation layer. The rounded interface of the electrical isolation layer minimizes stresses associated with high temperature and high pressure environments.

In a second provided example, the electrical isolation layer is patterned so that 90 degree angles are rounded. The rounded angles further mitigate stresses associated with high temperatures

BRIEF DESCRIPTION OF THE DRAWINGS

Presently preferred embodiments are described below in conjunction with the appended drawing figures, wherein like reference numerals refer to like elements in the various figures, and wherein:

FIG. 3 is a cross sectional view of the growth of a silicon dioxide layer during a LOCOS process;

FIG. 4 is a cross sectional view of the removal of the mask layer and subsequent doping of the silicon to form the leadout and piezo-resistors;

DETAILED DESCRIPTION

A method of electrically isolating a MEMS device is presented. A variety of MEMS devices, such as comb drives, micro-actuators, accelerometers, etc., may be fabricated using the disclosed method. One type of MEMS device, a piezo-resistive based pressure sensor structure, may also be electrically isolated using this method.

Figure 1:
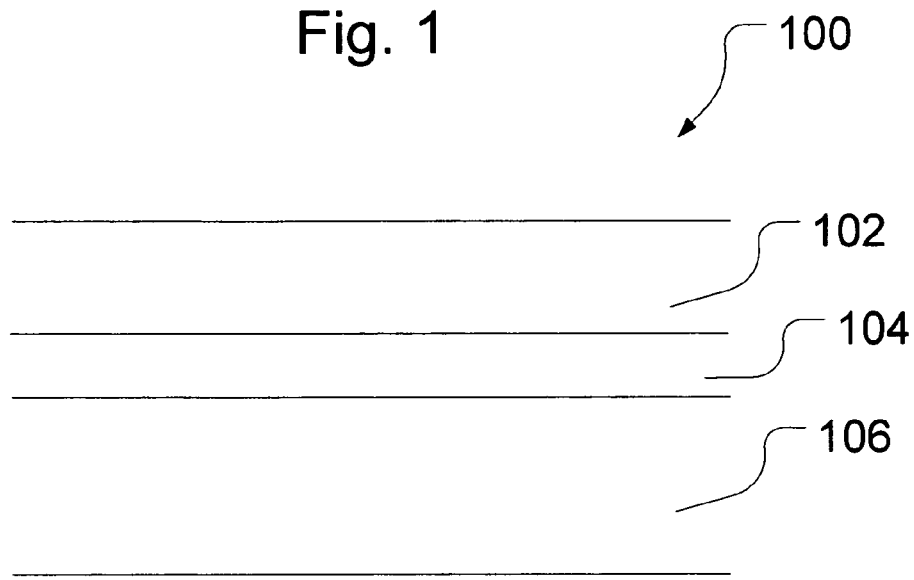
FIG. 1 is a cross sectional view of an SOI substrate.

Turning now to FIG. 1, one such piezo-resistive sensor 100 is illustrated. The piezo-resistive sensor 100 includes an epitaxial layer 102, which may be n-type or p-type silicon, a dielectric layer 104, which may be silicon-dioxide ($SiO_2$), and a substrate layer 106, which may be n-type, p-type, or bulk silicon.

Figure 5:
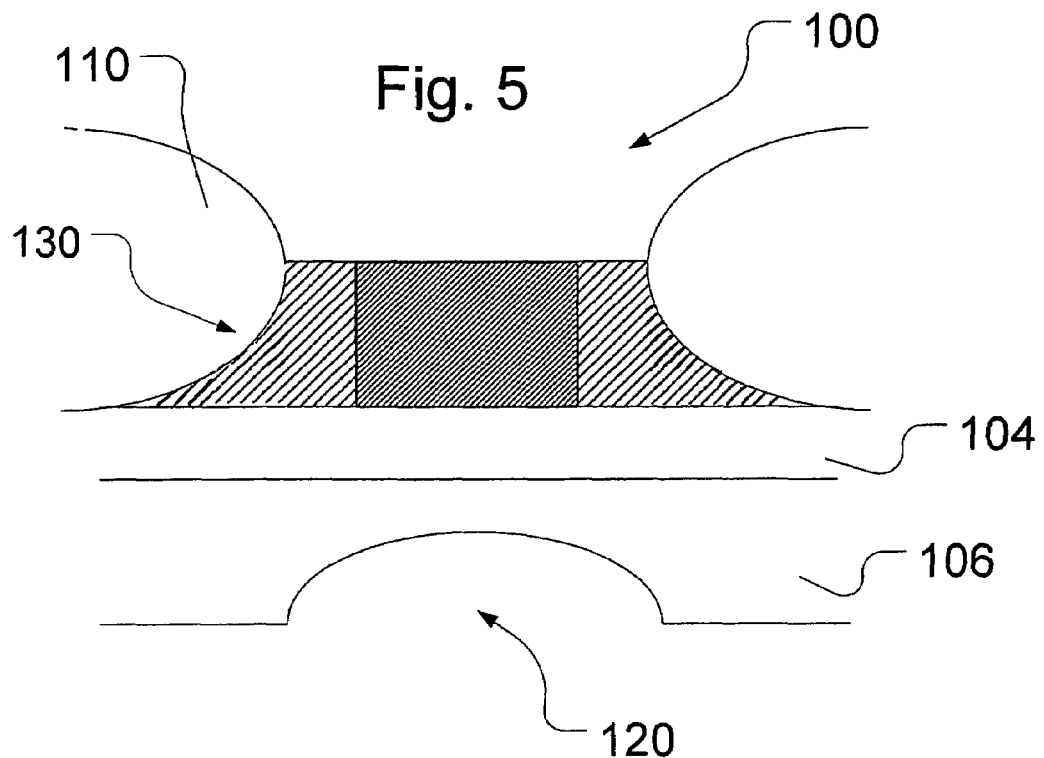
FIG. 5 is a cross-sectional view of the substrate of FIG. 1 including a cavity.

Although the substrate layer 106 is shown as a single layer, additional layers may be included. An "etch-stop" layer, for example, may be located in between the second layer 104 and the bulk substrate layer 106. In addition, a cavity may also be included in the substrate layer 106. The cavity may serve as a diaphragm for a pressure sensor. Alternatively, the cavity may be fabricated at a subsequent step. The inclusion of a cavity will be further described with reference to FIG. 5.

Figure 2:
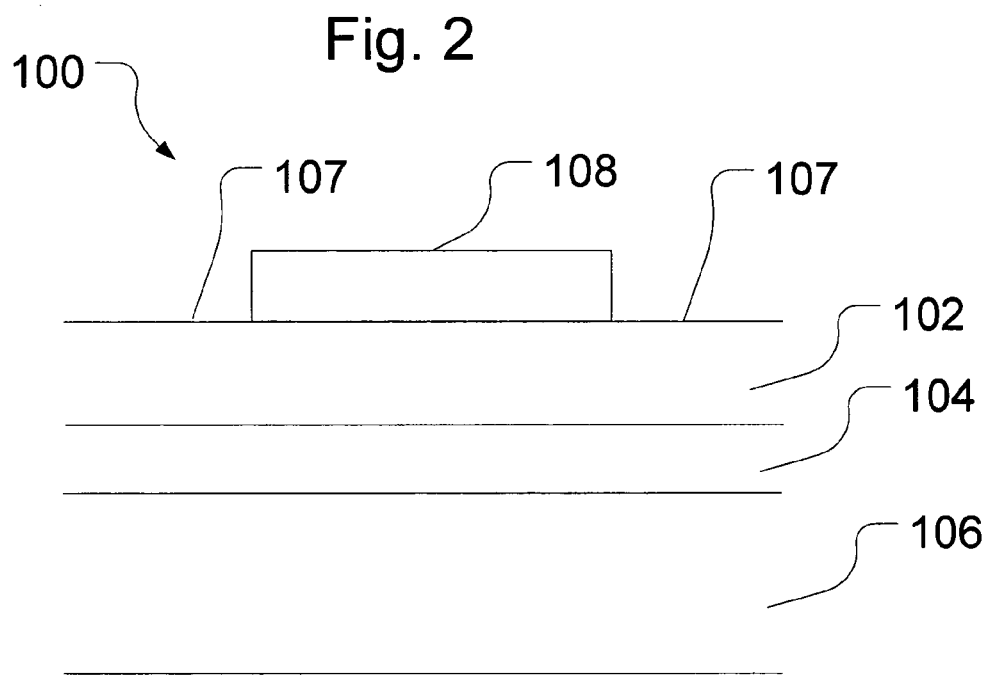
FIG. 2 is a cross sectional view of the formation of a mask layer on the substrate of FIG. 1.

FIG. 2 shows a mask 108 formed on top of the epitaxial layer 102. The mask 108 may be silicon nitride ($Si_3N_4$), for example. Forming the mask 108 may include growing a thin thermal oxide followed by the deposition of a mask layer (such as a $Si_3N_4$) and patterning the mask layer so as to define the mask 108. The mask 108 made be patterned by a conventional photolithography and etching process. The mask 108 includes an "island" which is located on top of the piezo-resistor structure. The island inhibits oxidation of the surface area above the piezo-resistor structure. In the un-covered areas 107 of the epitaxial layer 102 that are in close proximity to the mask 108, the rate of oxidation may be reduced in relation to the oxidation rate of un-covered areas that are not in close proximity to the mask 108.

In FIG. 3, the SOI substrate 100 has undergone a Local Oxidation of Silicon (LOCOS) process. LOCOS is an isolation scheme commonly used in MOS/CMOS silicon technology. LOCOS is used to thermally grow thick pads of silicon dioxide which are used to separate adjacent devices (e.g. such as CMOS Field Effect Transistors or FETs). As described above, the un-covered areas of the mask 108 (such as first exposed portion 107 in FIG. 2) are locally oxidized, hence, "local" oxidation. During the oxidation, silicon reacts with oxygen, the silicon is consumed, and a $SiO_2$ layer is produced. After the LOCOS step, the mask 108 may be removed by a conventional etching process, such as dry or wet chemical etch.

During the LOCOS step, silicon reacts with oxygen at a high temperature. Thus, as shown in FIG. 3, a layer of silicon dioxide 110 is grown on the first exposed portions 107 of the epitaxial layer 102. Because the growth rate of the silicon dioxide is reduced in the un-covered areas 107 in close proximity to the mask 108, the epitaxial layer 102 is not oxidized as quickly in the areas of close proximity to the mask 108. Therefore, a reduced silicon dioxide thickness is produced in those areas. As a result, the piezo-resistor, or epitaxial layer 102, will have a curved, or graded, profile, commonly referred to as a "bird's beak."

The mask layer is then removed as shown in FIG. 4. The radius of curvature of the rounded profile 130 is dependent upon the conditions of the LOCOS process (i.e., time, temperature, film thicknesses, etc.) In contrast to having an abrupt transition between the silicon dioxide layer 110 and the piezo-resistor structure, the rounded profile 130 offers a more gradual transition. This gradual transition reduces cracking when the piezo-resistor structure is exposed to high temperatures and/or pressures.

The epitaxial layer 102 in the example of FIG. 4 includes leadout resistances 103A and 103B, and a piezo-resistor 105. The readout resistances 103A and 103B may be used to provide an ohmic contact to the piezo-resistor 105. Conventional or novel CMOS fabrication methods may be used to create the piezo-resistor 105 and leadout resistances 103A and 103B. Such methods include ion implantation, photolithography and development, and/or chemical wet and dry etching. The doping density of the leadout resistances 103A and 103B may be established at various points of the piezo-resistor structure. For example, the piezo-resistor 105 may have an intrinsic doping density or it may be implanted and/or annealed at a later fabrication step. The leadout resistances 103A and 103B may also be tailored to provide a desired contact to the piezo-resistor 105.

Prior to or subsequent to forming an electrical isolation, a cavity 120 may be formed in the bulk substrate layer 106. The cavity 120, illustrated in FIG. 5, may serve to form a diaphragm which allows the piezo-resistor 105 to vary with applied pressure. Because the epitaxial layer is crystalline in nature, a larger pressure applied to the diaphragm will deflect the diaphragm and change the resistance of the piezo-resistor 105. The cavity 120 may be designed to form diaphragms of higher aspect ratios so that the piezo-resistor is more sensitive to changes in applied pressure.

Figure 6A:
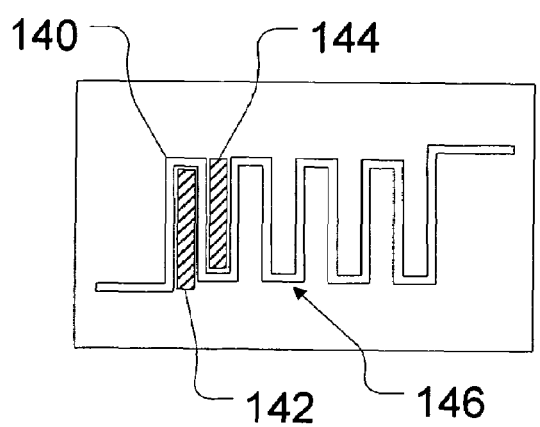
FIG. 6A is a top view of an electrically isolating line.
Figure 6B:
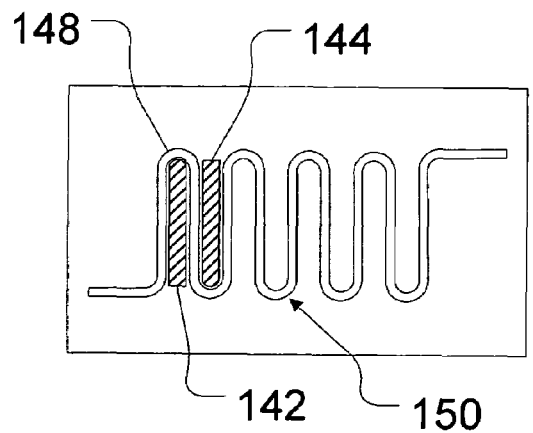
FIG. 6B is a top view of another electrically isolating line.

Another method which may be used to reduce cracking associated with the silicon dioxide layer 110, is to have an electrical isolation scheme where the silicon dioxide based isolation lines are also laid out with a curved or rounded profile. Generally, electrical isolation lines are laid out perpendicular to each other. In FIG. 6A, a top view of electrical isolation line 140 is used to isolate MEMS device 142 from MEMS device 144. The isolation line 140 has sharp 90 degree angles 146. These sharp angles 146 create localized stress points that are vulnerable to cracking at high temperatures. In FIG. 6B, the vulnerability of the stress points is mitigated by using electrical isolation line 148, which has curved angles 150. The stress points may be eliminated by distributing the stress associated with line 148 across the curved angles 150. Mask layer 108 may be patterned so as to create the curved angles 150 (see FIG. 2). Additionally, the curved angles 150 may be produced at a later subsequent patterning step.

While certain features and embodiments of the present invention have been described in detail herein, it is to be understood that other variations may be made without departing from the intended scope of the invention. For example, a variety of MEMS devices using an assortment of semiconductor fabrication techniques, including various methods of etching and deposition, may be electrically isolated without departing from the scope of the invention itself. The claims should not be read as limited to the described order or elements unless stated to that effect. Therefore, all embodiments that come within the scope and spirit of the following claims and equivalents thereto are claimed as the invention.

We claim:

1. A method of creating electrical isolation for a Micro-Electro-Mechanical System (MEMS) device including a silicon region that is to be oxidized, the method comprising:

creating a mask layer on top of the MEMS device, the mask layer substantially covering the MEMS device and defining an exposed portion of the silicon region; and growing a silicon dioxide ($SiO_2$) layer in a Local Oxidation of Silicon (LOCOS) process on top of the silicon region, the silicon region being consumed so as to create the $SiO_2$ layer, the $SiO_2$ layer and the silicon region comprising a curved interface, the curved interface being produced in the LOCOS process and reducing film stress associated with exposure to high temperatures and pressures.

2. The method as in claim 1, wherein the $SiO_2$ layer is patterned with a curved angle so as to further reduce film stress associated with exposure to high temperatures and pressures, the curved angle having a radius of curvature determined by the conditions associated with the LOCOS processing.

3. The method as in claim 1, wherein the mask layer is silicon nitride ($Si_3N_4$).

4. The method as in claim 1, wherein the MEMS device is a piezo-resistor structure.

5. The method as in claim 4, wherein the piezo-resistor is located in the silicon region and is electrically coupled to a readout resistance located in the epitaxial layer.

6. The method as in claim 1, wherein the MEMS device is a pressure sensor comprising a piezo-resistor structure.

7. The method as in claim 6 wherein the piezo-resistor structure is located in the silicon region and is electrically coupled to a leadout resistance located in the silicon region.

8. The method as in claim 1 wherein the MEMS device is formed in a Silicon-On-Insulator (SOI) substrate.

9. The method of claim 8, wherein the SOI substrate includes a bulk silicon layer comprising a cavity located below a piezo-resistor, the cavity forming a diaphragm that allows the overall resistance of the piezo-resistor to be varied with pressure.

10. A method of electrically isolating first and second Micro-Electro-Mechanical System (MEMS) devices comprising a silicon region located in between the first and second MEMS devices, the method comprising:

creating a mask layer on top of the first and second MEMS devices, the mask layer substantially covering the first and second MEMS devices and defining an exposed portion of the silicon region;

growing a silicon dioxide ($SiO_2$) layer in a Local Oxidation of Silicon (LOCOS) process on top of the silicon region, the silicon region being consumed so as to create the $SiO_2$ layer, the $SiO_2$ layer and the silicon region comprising a curved interface, the curved interface being produced in the LOCOS process and reducing film stress associated with exposure to high temperatures and pressures; and patterning the $SiO_2$ layer with a curved angle so as to further reduce film stress associated with exposure to high temperatures.

11. The method as in claim 10, wherein the mask layer is silicon nitride ($Si_3N_4$).

12. The method as in claim 10, wherein the first MEMS device is a pressure sensor comprising a piezo-resistive structure.

13. The method as in claim 12, wherein the first MEMS device includes a piezo-resistor located in the silicon region being electrically coupled to a leadout resistance located in the silicon region.

14. The method as in claim 10, wherein the first and second MEMS devices are formed in a Silicon-On-Insulator (SOI) substrate.

15. The method as in claim 14, wherein the SOI substrate includes a bulk silicon layer comprising a cavity located below a piezo-resistor, the cavity forming a diaphragm that allows the overall resistance of the piezo-resistor to be varied with pressure.

\* \* \* \* \*